United States Patent [19]
Matsumoto

[11] Patent Number: 5,302,846
[45] Date of Patent: Apr. 12, 1994

[54] SEMICONDUCTOR DEVICE HAVING IMPROVED VERTICAL INSULATED GATE TYPE TRANSISTOR

[75] Inventor: Shigeyuki Matsumoto, Atsugi, Japan

[73] Assignee: Canon Kabushiki Kaisha, Tokyo, Japan

[21] Appl. No.: 986,890

[22] Filed: Dec. 8, 1992

Related U.S. Application Data

[63] Continuation of Ser. No. 708,216, May 31, 1991, abandoned.

[30] Foreign Application Priority Data

Jun. 4, 1990 [JP] Japan ................. 2-144544

[51] Int. Cl.$^5$ ............. H01L 29/76; H01L 29/94; H01L 31/062; H01L 23/48
[52] U.S. Cl. ................. 257/329; 257/330; 257/412; 257/734
[58] Field of Search ........... 357/23.1, 23.11, 55; 257/329, 330, 412, 734

[56] References Cited

U.S. PATENT DOCUMENTS

| | | | |
|---|---|---|---|
| 4,786,953 | 11/1988 | Morie et al. | 357/55 |
| 4,835,584 | 5/1989 | Lancaster | 357/23.1 |
| 4,835,585 | 5/1989 | Panousis | 357/23.11 |
| 4,910,564 | 3/1990 | Inoue | 357/23.4 |
| 4,964,080 | 10/1990 | Tzeng | 357/55 |
| 4,996,574 | 2/1991 | Shirasaki | 357/55 |
| 5,047,812 | 9/1991 | Pfiester | 357/55 |

FOREIGN PATENT DOCUMENTS

| | | | |
|---|---|---|---|
| 54-23478 | 2/1979 | Japan | 357/23.1 |
| 59-228762 | 12/1984 | Japan | 257/330 |
| 62-136877 | 6/1987 | Japan | 357/23.1 |
| 64-21968 | 1/1989 | Japan | 257/330 |
| 1-183855 | 7/1989 | Japan | 357/23.1 |
| WO86/03341 | 6/1986 | PCT Int'l Appl. | 257/329 |
| 2195663 | 4/1988 | United Kingdom | 257/734 |

OTHER PUBLICATIONS

IBM Technical Disclosure Bulletin, vol. 29, No. 10, Mar. 1987, pp. 4305-4307; "Trench MOSFET (3-D Structure)".

*Primary Examiner*—Rolf Hille
*Assistant Examiner*—Steven Loke
*Attorney, Agent, or Firm*—Fitzpatrick, Cella, Harper & Scinto

[57] ABSTRACT

A semiconductor device is provided having an insulated gate type transistor comprising a semiconductor body. First and second semiconductor regions define source and drain regions buried in the semiconductor body. A third semiconductor region defines a channel region disposed between the first and second semiconductor regions. A recess is provided having a bottom surface and a side surface. The recess is formed in the semiconductor body and is provided adjacent to the third semiconductor region. An insulating film is formed on the entire side surface of the recess, and a gate electrode comprising a metallic region is provided in the recess. The first, second and third regions, the gate electrode region and the insulating film are juxtaposed in a direction along a main face of the semiconductor body. The insulating film and the gate electrode region substantially occupy the recess.

3 Claims, 10 Drawing Sheets

SEMICONDUCTOR DEVICE HAVING IMPROVED VERTICAL INSULATED GATE TYPE TRANSISTOR

This application is a continuation of application Ser. No. 07/708,216, filed May 31, 1991, now abandoned.

BACKGROUND OF THE INVENTION

1. Field of the Invention

This invention relates to a semiconductor integrated circuit device such as memory, photoelectric converting device, signal processing device, etc. to be mounted on various electronic instruments, particularly to an insulated gate type transistor thereof.

2. Related Background Art

In recent years, as an effort for higher integration, it has been desired to apply practically finely worked functional devices such as development of MOS transistor with the gate length of submicron order, etc.

FIG. 1 to FIG.3 are schematic cross-sectional views showing the structure of the MOS transistor of the prior art. FIG. 1 is N-MOS transistor with a single drain structure having a gate 201, an oxidized film 202, a source 203 and a drain 204, which is the simplest structure, and its production process is also simple. However, with the progress of finer formation of the device, when the gate length becomes 1.2 μm or less, deterioration of the actuation of the MOS transistor will occur. FIG. 2 has the low concentration regions 205 and 206 provided for relaxing the electrical field between the source and the drain for preventing it, and is called the LDD (lightly doped drain) structured. Further, as the LSI for DRAM which is most progressed in finer formation, a thin Transistor cell (TTC) as shown in FIG. 3 has been proposed. TTC has a groove provided in the semiconductor substrate 211, and a transistor and a capacitor are formed at the same time. More specifically, it has a gate oxidized film 213, with the channel portion 214 being located on the side face of the gate oxidized film. In the groove at the lower part of the gate 212, a polycrystalline Si 215 is filled and deposited to form an electrode of the capacitor for memory, with its surface being oxidized to form an inductor film 216 for capacitor. The buried source 217 is formed at the upper part of the polycrystalline Si 216. Further, it is equipped with the word line 218 with the polycrystalline Si, the n+ diffusion layer as the drain and pit line, and is separated electrically through the separation oxidized film 220 from the adjacent cells. On the insulation film 221, the interlayer insulation film 222 are respectively formed the wiring patterns 223 and 224. The TTC, having the MOS transistor and capacitor formed in the vertical direction, has such advantages that it is smaller in area, and also erroneous actuation due to influence of α-ray will occur with difficulty, and further it is free from parasitic transistor. Region 219 has a relatively low concentration of impurities and is provided for relaxing the electrical field between the source and drain regions.

However, the groove type transistor cell as described above has still room to be improved in the following points.

1) In the semiconductor device shown in FIG. 3, only with respect to the transistor portion, the aspect ratio (groove depth/opening diameter) is about 2, and therefore the yield is lowered by the defect which occurs by Si etching, and further uniform formation of the insulation film of good quality can be formed with difficulty in the groove, thus posing a problem in reliability.

2) Further, polycrystalline silicon which is the control electrode member to be generally used in TTC cannot make the resistivity about 1 mΩcm or lower even if an impurity may be diffused to the maximum extent, whereby it is impossible to make smaller the propagation, delay time which determine the speed of the transistor. Even if a silicide (Si metal alloy) may be employed in place of polycrystalline silicon, the resistivity is about 100 to 200 μΩcm and no transistor of high speed, high yield and high reliability could be obtained.

3) Further, generally speaking, the control electrode is deposited on the semiconductor device surface uniformly and therefore the surface of the control electrode reflects the unevenness itself of the groove, as opposite to flattening. Shortly speaking, for maintaining of high reliability of the wiring deposited on the control electrode, an insulation film must be attached on the control electrode, and flattening effected according to the method of etch-back. This method is a method which leaves the resist only at the concavity thickly and cuts simultaneously the insulation film at the resist concavity in rf plasma, and since the influence of rf exerted on MOS transistor is extremely great, the risk of impairing the yield, reliability has been very great.

SUMMARY OF THE INVENTION

An object of the present invention is to solve such technical task and provide a semiconductor device with a small area and a flat surface.

In order to accomplish such object, the semiconductor device according to the present invention is a semiconductor device comprising an insulation gate type transistor having source and drain regions comprising semiconductors, a gate insulation film and a gate electrode region, wherein said source and drain regions, said gate insulation film and said gate electrode region are juxtaposed in the direction along the main face of a semiconductor substrate and at least a part of them is buried in said substrate.

For example, the semiconductor of the present invention can be prepared by a process for preparing the semiconductor device including a transistor having source and drain regions comprising semiconductors, a gate insulation film and a gate electrode region, having the step of burying at least a part of the above source and drain regions, the gate insulation film and the gate electrode in the semiconductor substrate and the step of arranging the above source and drain regions and the above gate electrode region in the direction along the main face of the above substrate.

According to the present invention, since the control electrode is buried from the surface to the lower part of the semiconductor substrate, an MOS transistor with small area and flat surface can be realized, and therefore an MOS transistor having high reliability can be obtained.

DETAILED DESCRIPTION OF THE PREFERRED EMBODIMENTS

In the following, the present invention is disclosed along with the embodiments, but it should be understood that the present invention should not be limited to the disclosed embodiment. Variety of modifications which can accomplish the object of the present invention can be made without deviating from a scope of the invention.

Figure 4:
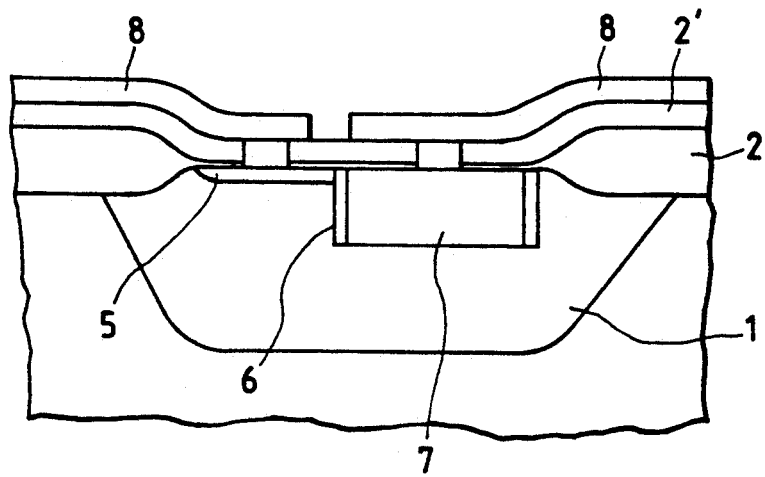
FIG. 4 is a schematic a cross-sectional view for illustration of the preparation method of a preferable embodiment of the present invention.

FIG. 4 is a cross-sectional view for illustration of the preferred embodiment of the present invention. The present invention forms a part or all of the control electrode region 7 of an MOS transistor buried from the surface of the semiconductor substrate 1. Also, the present invention forms a part or all of the channel portion 6 for effecting transistor actuation of the MOS transistor at the lower part of said surface.

Further, the present invention forms a part or all of said control electrode by selective deposition according to the chemical gas phase reaction, thereby forming flatly the surface of said semiconductor device.

In the embodiment shown in FIG. 4, source (drain) region 5, insulation films 2, 2' and wiring layer 8 are shown, but the present invention is not limited to such structure as mentioned previously.

For forming the control electrode region in the groove and also accomplishing flatness of the semiconductor device surface, the metal system film selective deposition method of Al, etc. as described above is effective.

EXAMPLE 1

Figure 5A:
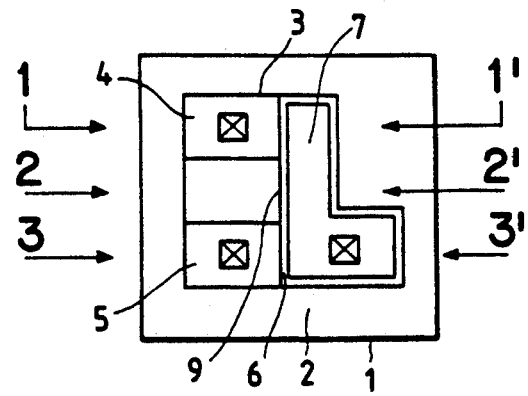
FIGS. 5A to 5D are a plan view and sectional views of an example of the present invention.
Figure 5B:
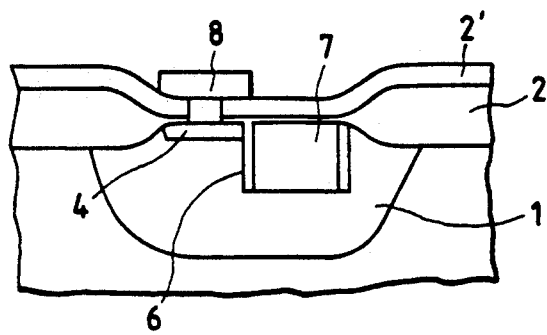
Figure 5C:
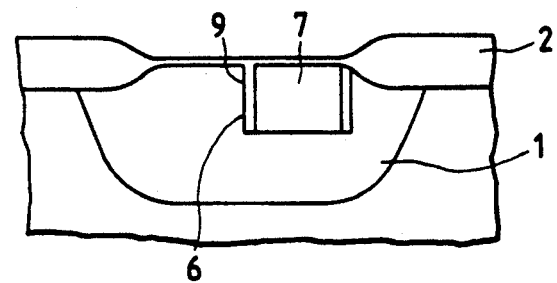
Figure 5D:
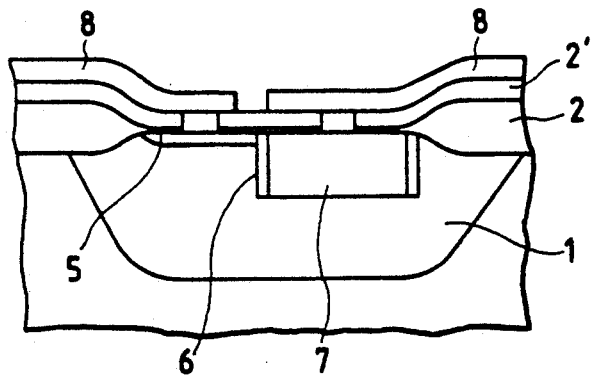

FIGS. 5A–5D show an NMOS transistor as an example of the present invention. FIG. 5A is a plan view of the NMOS transistor formed at the portion surrounded by P well 1, field oxidized film 2, FIGS. 5B, 5C and 5D are respectively cross-sectional views along the lines 1-1', 2-2' and 3-3' in FIG. 5A.

The source 4, the drain 5 of the present NMOS transistor are arranged at the positions apart on plane, and adjacent to the source 4 and the drain 5 are respectively arranged the gate oxidized film 6 in the vertical direction from the surface to the lower part of the substrate, and adjacent to the gate oxidized film 6 and from the substrate surface is located gate electrode (control electrode) region 7 deep from the source 4, the drain 5 buried therein. The region between the source 4 and the drain 5 apart from each other is the region called channel 9 where transistor actuation is effected. The surface of the present transistor is approximately flat because the control electrode region is buried.

The present transistor is covered on the surface with the interlayer insulation film 2', and metal wiring 8 of Al, etc. is drawn out through the contact hole for drawing out the electrodes from the source 4, the drain 5 and the gate electrode. Also in the formation step of the metal wiring 8, for preventing Al burying in the contact hole portion, there may be effectively employed the method in which Al, etc. is selectively deposited within the contact hole, namely only on the semiconductor substrate to bury the contact hole, and then a wiring material is deposited on the whole surface of the insulation film, and wiring is formed by patterning.

Next, actuation is described.

The MOS transistor according to the present invention is a device which controls the conductance of the channel portion 9 between the source electrode 4 and the drain electrode 5 by the gate electrode 7. When a voltage $V_D$ is applied between the source electrode 4 and the drain electrode, if a voltage $V_G$ is applied, current flows based on the following formulae, namely:

when $V_D < V_G - V_T$ $$I_D = \frac{W}{L} \mu \, Cox \left[ (V_G - V_T)V_D - \frac{1}{2} V_D^2 \right]$$

when $V_D > V_G - V_T$ $$I_D = \frac{1}{2} Cox \cdot \mu \cdot \frac{W}{L} (V_G - C_T)^2$$

(Cox: gate capacitance, $\mu$: carrier mobility, W: channel width, L: channel length, $V_T$: threshold value voltage).

At present, what is demanded for MOS transistor is 1) to make the transistor in small area, and 2) to perform transistor actuation at high speed.

The present example has made improvements to great extent concerning the two points as mentioned above, and the area of the transistor became 80% of that of the prior art. Concerning speed, there is the resistance of the gate electrode as a great factor. In the case of a polycrystalline Si gate which has been used in the prior art, it is 300 to 80 $\Omega/cm^2$, and 2 to 5 $\Omega/cm^2$ has been accomplished by silicide formation, while in the case of the present invention a low resistance of $1 \times 10-5$ $\Omega/cm^2$ could be realized. The reason is that the metal electrode is directly buried, and also the Al used has a single crystalline structure and further it is of the buried type, whereby film thickness can be taken sufficiently thick.

EXAMPLE 2

Figure 6:
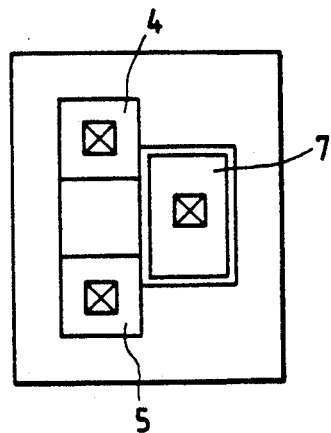
FIG. 6 to FIG. 8 are each a plan view of another example of the present invention.

FIG. 6 is a plan view of another example of the NMOS transistor according to the present invention. This example, for realizing still higher speed-up, is an example in which the capacitance is reduced by making smaller the overlapping portion between the gate electrode 7 and the source electrode 4 and the drain electrode 5. That is, by varying the arrangement of the gate electrode 7, capacitance could be reduced as compared with the example shown in FIG. 5 while ensuring channel.

EXAMPLE 3

Figure 7:
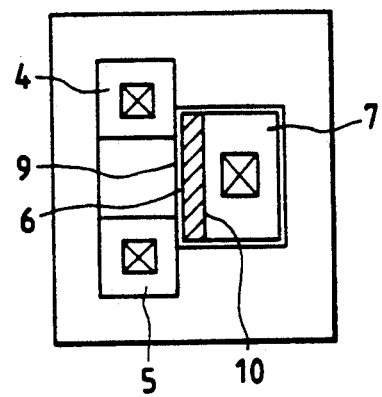

FIG. 7 shows a plan view of still another example. The present example has a gate electrode material located through the polycrystalline Si, etc. 10 so that the channel portion 9 will not contact directly the member constituting the gate electrode 7 through the insulation film 6. With such constitution, diffusion of the gate electrode member directly to the insulation film is prevented, and also by use of a polycrystalline silicon Si which used in the process of the prior art, without use of the work function of the gate electrode member, an MOS transistor having entirely the same characteristics as in the prior art can be obtained. Further, because the direct resistance of the gate electrode is reduced, a fine MOS transistor of high speed could be obtained.

EXAMPLE 4

Figure 8:
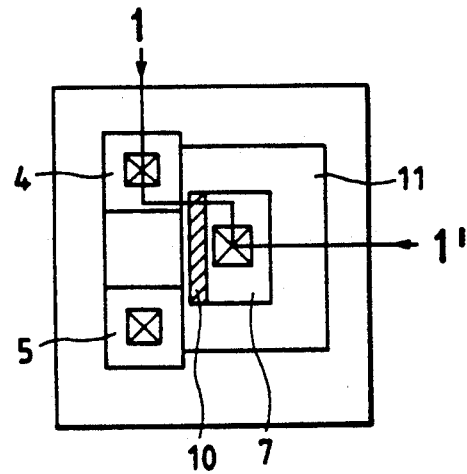

FIG. 8 is a plan view of still another example of the present invention. The present example, for the purpose of further reducing the parasitic capacitance of the gate electrode 7 and the P well 1 as compared with the example shown in FIG. 7, has made the oxidized film 11 in the peripheral three directions of the opening of the buried portion of the gate electrode member thicker to have parasitic capacity reduced greatly.

Next, the process for preparing the example shown in FIG. 8 is described. FIGS. 9A to 9G show the cross-sectional views along the line 1-1' of the example shown in FIG. 8.

First, according to the method of the prior art, P well 102 was formed on the N type Si substrate 101, and the oxidized film 103 with a thickness of 12,000 Å on the substrate surface was partially removed.

Figure 9A:
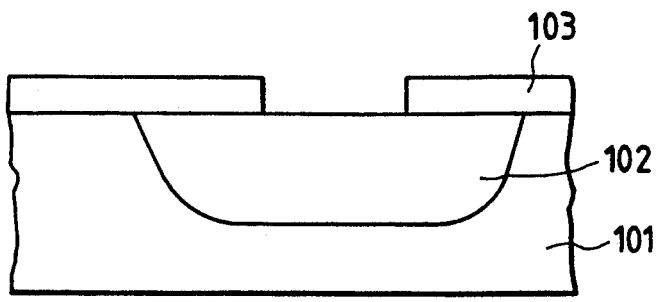
FIGS. 9A to 9G are schematic cross-sectional view for illustration of the preparation method of the example shown in FIG. 8.
Figure 9B:
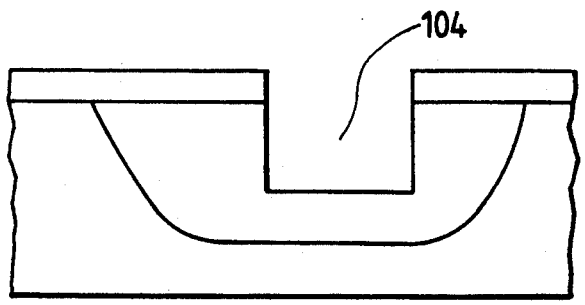

Next, with the oxidized film 103 of 12,000 Å as the mask, the substrate was etched according to the RIE (reaction ion etching) method by use of gases of $Cl_2$, $CBrF_3$, to form a groove 104. The etching depth of the substrate is 3 μm (FIG. 9B)

Figure 9C:
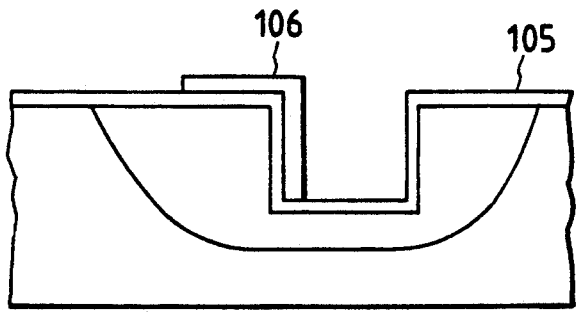

Next, the above oxidized film 103 was removed to form a thermally oxidized film 105 and an SiN film 106 with a thickness of 1000 Å on the whole substrate surface, followed by partial removal of the SiN film. (FIG. 9C)

Figure 9D:
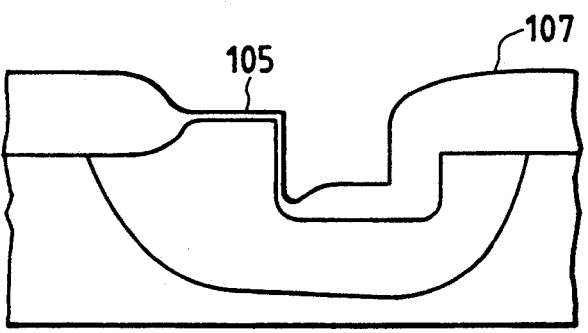

According to the LOCOS method which has been used in the prior art, a field oxidized film 107 was formed only at the portion where the SiN film 106 was removed. The formation conditions were $O_2$: 2 liter/min., $H_2$: 4 liter/min., oxidation temperature 1000° C., film thickness 8000 Å. Then, the SiN film 106 was removed (FIG. 9D).

Figure 9E:
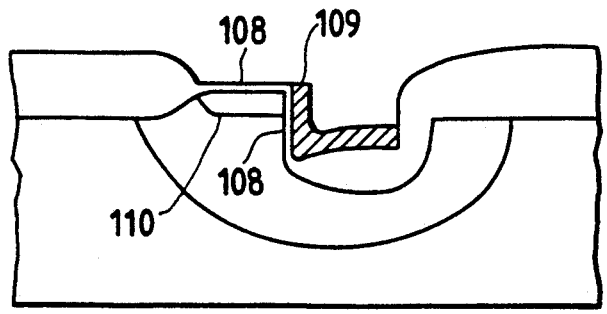

Next, after the oxidized film 105 on the substrate was completely removed in HF atmosphere, a gate insulation film 108 was formed. The formation temperature was 850° C., and the film thickness 180 Å. As a part of the gate electrode of the MOS transistor, a polycrystalline Si 109 was formed on the whole surface of the gate insulation film 108 by pyolysis of $SiH_4$, and partially removed by RIE mode in $CCl_2F_2$ atmosphere. Further, for formation of the source and drain diffusion layer 110 of the MOS transistor, arsenic was ion injected at $5 \times 10^{15}$ ions/cm$^2$. Arsenic was also injected into the polycrystalline Si 109 to play a role of lowering specific resistance of the polycrystalline Si. Next, for activating electrically the source and drain diffusion layer 110, heat treatment was carried out at 1000° C. for 15 seconds according to the RTA (rapid thermal annealing) method. (FIG. 9E)

Next, Al 111 was deposited only on the polycrystalline Si 109.

Figure 9F:
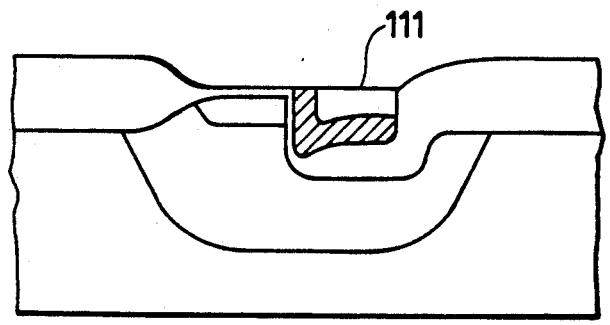

The deposition method is described below. First, the substrate was placed in the reaction chamber of a CVD apparatus, and the reaction chamber was internally evacuated to $1 \times 10^{-8}$ Torr. And, through the feeding gasline, DMAH was fed. For the carrier gas, $H_2$ was employed. Further, through another gasline, $H_2$ as the reaction gas was permitted to flow onto the substrate heated to 270° C. A typical pressure in this case is ca. 1.5 Torr, and the partial pressure of DMAH ca. $5 \times 10^{-3}$ Torr. According to this method, Al is deposited selectively only on the polycrystalline Si 109 having electroconductivity, and not deposited on the oxidized film 108 and the field oxidized film 107. Hence, Al 111 forms a part of the gate electrode of the MOS transistor. (FIG. 9F)

Figure 9G:
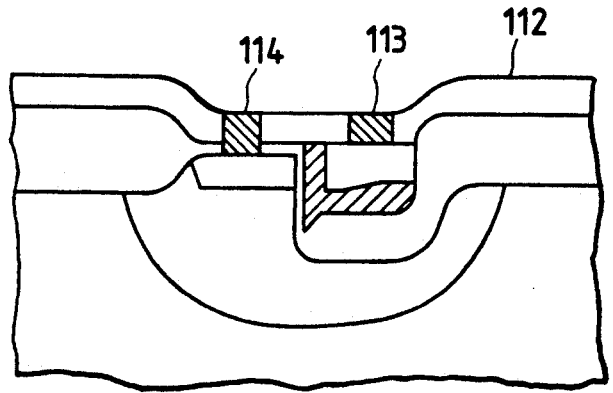

Next, BPSG is deposited as the interlayer insulation film 112, the contact hole 113 opened for taking out the electrode, and Al 114 was buried within the contact hole 112 according to the Al-CVD method as described above. (FIG. 9G)

Thus, the MOS transistor shown in FIG. 8 was prepared.

EXAMPLE 5

Figure 10A:
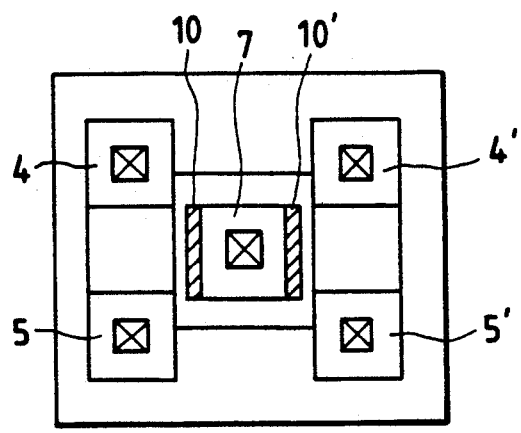
FIGS. 10A and 10B are a plan view and an equivalent circuit diagram of still another example of the present invention.
Figure 10B:
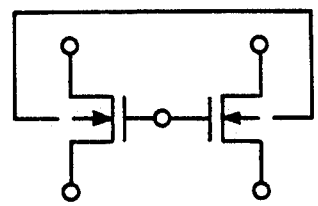

FIG. 10 shows still another example. FIG. 10A shows a plan view, and FIG. 10B an equivalent circuit. This example is one example having two NMOS transistors connected with the common electrode 7.

EXAMPLE 6

Figure 11A:
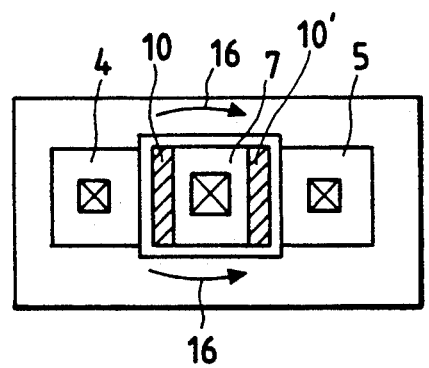
FIGS. 11A and 11B are a plan view and a cross-sectional view of still another example of the present invention.
Figure 11B:
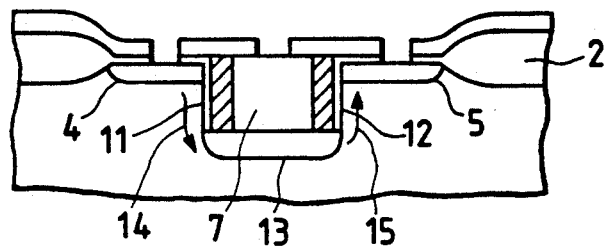

FIG. 11 shows still another example. FIG. 11A is a plan view and FIG. 11B a sectional view. The basic difference of this example from the embodiments shown in FIG. 5 to FIG. 10 is the point that the channel portions 11 and 12 are formed in the direction vertical to the substrate surface along the gate electrode 7 buried. When a voltage $V_G$ is applied on the gate electrode 7, the current from the source 4 to the drain 5 flows in the direction of the arrowhead 14 to flow into the high impurity region (n+) 13 provided immediately below the gate electrode 7 comprising polycrystalline Si and a metal member. Further, the current flows in the direction of the arrowhead 15 by passing through the channel 12 to flow into the drain electrode 5. In the current, there exist the current component which flows in the vertical direction to the surface, and at the same time the component which flows in the direction shown by the arrow head 16 in FIG. 11A along the surface.

The film forming method preferable for the present invention is to form a deposited film by the surface reaction on an electron-donative substrate by use of a gas of an alkylaluminum hydride and hydrogen gas (hereinafter called the Al-CVD method).

Particularly, by use of monomethylaluminum hydride (MMAH) as the starting gas or dimethylaluminum hydride (DMAH) as the starting gas, and $H_2$ gas as the reactive gas, and heating the substrate surface under the mixture of these gases, an Al film of good quality can be deposited. Here, during the selective deposition of Al, it is preferable to maintain the surface temperature at the decomposition temperature of the alkylaluminum hydride or higher and less than 450° C., more preferably 260° C. to 440° C.

As the method for heating the substrate to the above-mentioned temperature range, there are direct heating and indirect heating. Particularly, by maintaining the substrate at the above-mentioned temperature by direct heating, an Al film of good quality can be formed at high deposition speed. For example, when the substrate surface temperature during Al film formation is made 260° C. to 440° C. which is more preferable temperature range, a film of good quality can be obtained at higher deposition speed of 300 Å to 5000 Å/min. which is higher than in the case of resistance heating. As such direct heating method (substrate itself is heated by direct transmission of the energy from the heating means to the substrate), for example, lamp heating by means of halogen lamp, xenon lamp, etc. may be included. As the method for indirect heating, there is resistance heating, by which heating can be performed by use of a heat-generating body, etc. provided at the substrate supporting member for supporting the substrate to form deposited film arranged in the space for formation of the deposited film.

By applying the CVD method to the substrate having the electron-donative surface portion and the non-electron donative surface portion co-present thereon, a single crystal of Al is formed under good selectivity only on the electron-donative substrate surface portion. The Al thus formed will have all of excellent characteristics desirable for the electrode/wiring material. That is, reduction of generation probability of hillock, reduction of generation probability of alloy spike will be accomplished.

This may be considered to be due to the fact that substantially no or extremely small formation of alloy spike, etc. on account of the eutectic reaction with the subbing silicon, etc. is seen, because Al of good quality can be formed on the surface comprising a semiconductor or an electroconductive member as the electron-donative surface, and also the Al is excellent in crystallinity. And, when employed for the electrode of a semiconductor device, an effect surpassing the concept of the Al electrode which has been contemplated in the prior art, and could not be even expected in the prior art can be obtained.

Having described above about the fact that the Al deposited on an electron-donative surface, for example, within the opening with the semiconductor substrate surface exposed becomes to have a single crystalline structure, according to the Al-CVD method, a metal film composed mainly of Al as described below can be also selectively deposited, and its film quality also exhibits excellent characteristics.

For example, in addition to a gas of an alkylaluminum hydride and hydrogen, a gas containing Si atoms such as $SiH_4$, $Si_2H_6$, $Si_3H_8$, $Si(CH_3)_4$, $SiCl_4$, $SiH_2Cl_2$, $SiHCl_3$, or the like, a gas containing Ti atoms such as $TiCl_4$, $TiBr_4$, $Ti(CH_3)_4$, etc., a gas containing Cu atoms such as copper bisacetylacetonate $Cu(C_5H_7O_2)$, copper bisdipivaloylmethanite $Cu(C_{11}H_{19}O_2)_2$, copper bishexafluoroacetylacetonate $Cu(C_5HF_6O_2)_2$, etc.

may be introduced in a preferable combination to form a gas mixture atmosphere, thereby forming an electrode by selective deposition of an electroconductive material such as Al-Si, Al-Ti, Al-Cu, Al-Si-Ti, Al-Si-Cu, etc.

The Al-CVD method as described above is a film forming method excellent in selectivity, and also the surface characteristic of the film formed has good surface characteristic. Hence, by application of a non-selective film forming method to the next deposition step, Al or a metal film composed mainly of Al can be also formed on the Al film selectively deposited as described above and $SiO_2$, etc. as the insulating film, whereby a preferable metal film having high usability for general purpose as the wiring of semiconductor device can be obtained.

Specific examples of such metal film include the following. There may be included combinations of Al, Al-Si, Al-Ti, Al-Cu, Al-Si-Ti, Al-Si-Cu, etc. deposited selectively with Al, Al-Si, Al-Ti, Al-Cu, Al-Si-Ti, Al-Si-Cu, etc.

As the film forming method for non-selective deposition, there are other CVD methods than the Al-CVD method as described above, the sputtering method, etc.

Film forming Apparatus

Next, a preferable film forming apparatus for forming the electrode according to the present invention is described.

Figure 12:
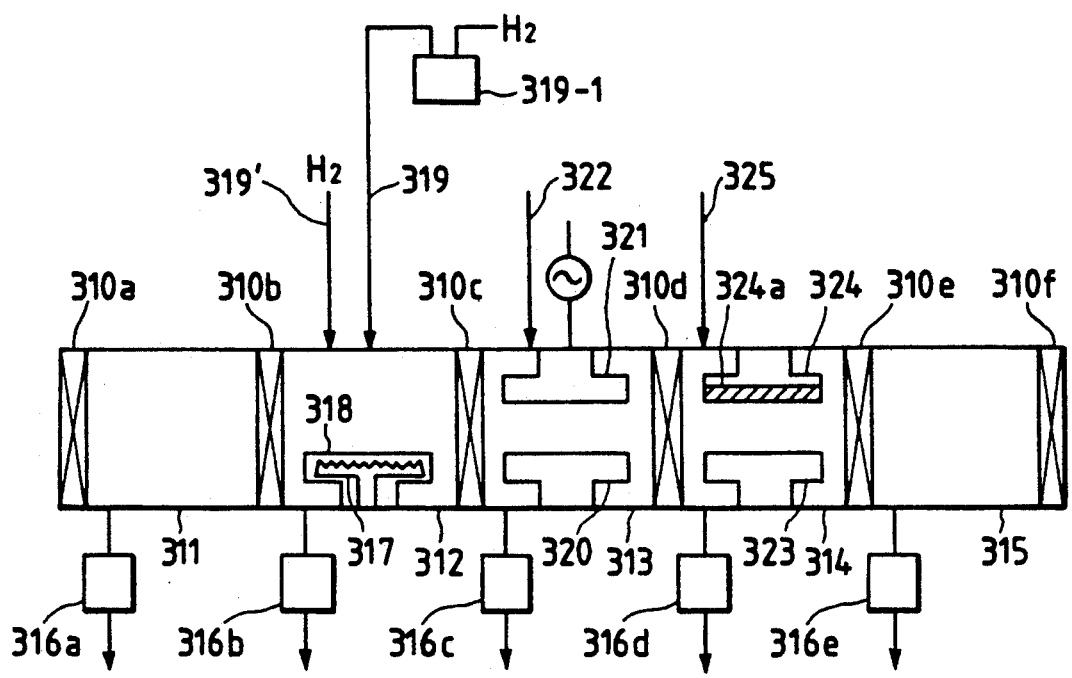
FIGS. 12 and 13 are schematic views showing an example of the film forming device to be use for practicing the film forming method suitable for formation of the wiring layer in the semiconductor device according to the present invention.
Figure 13:
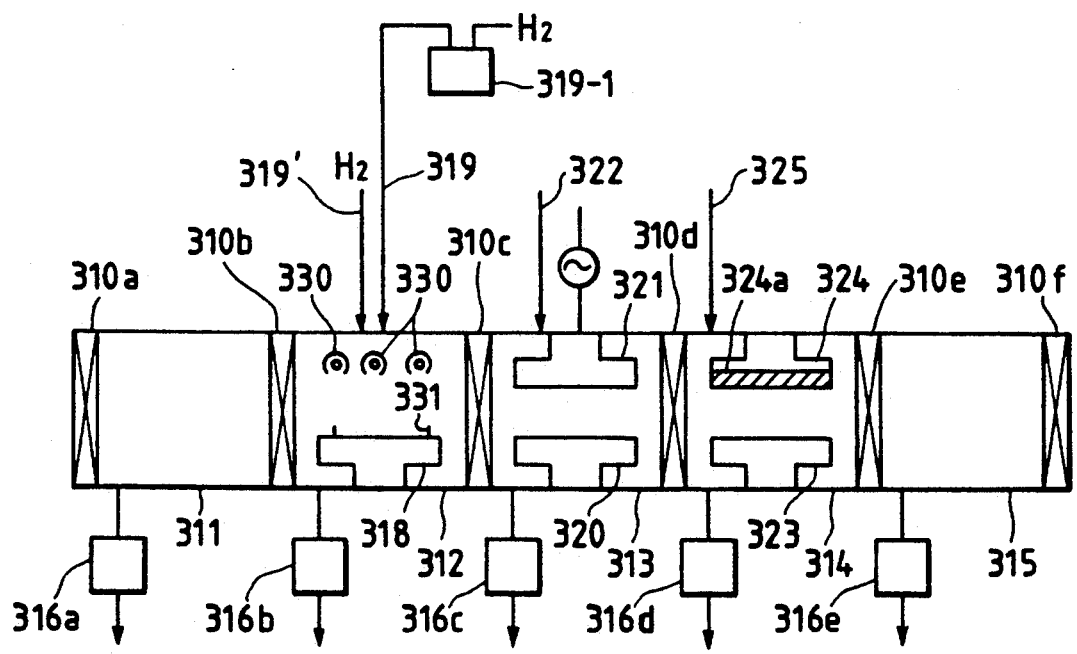
Figure 14:
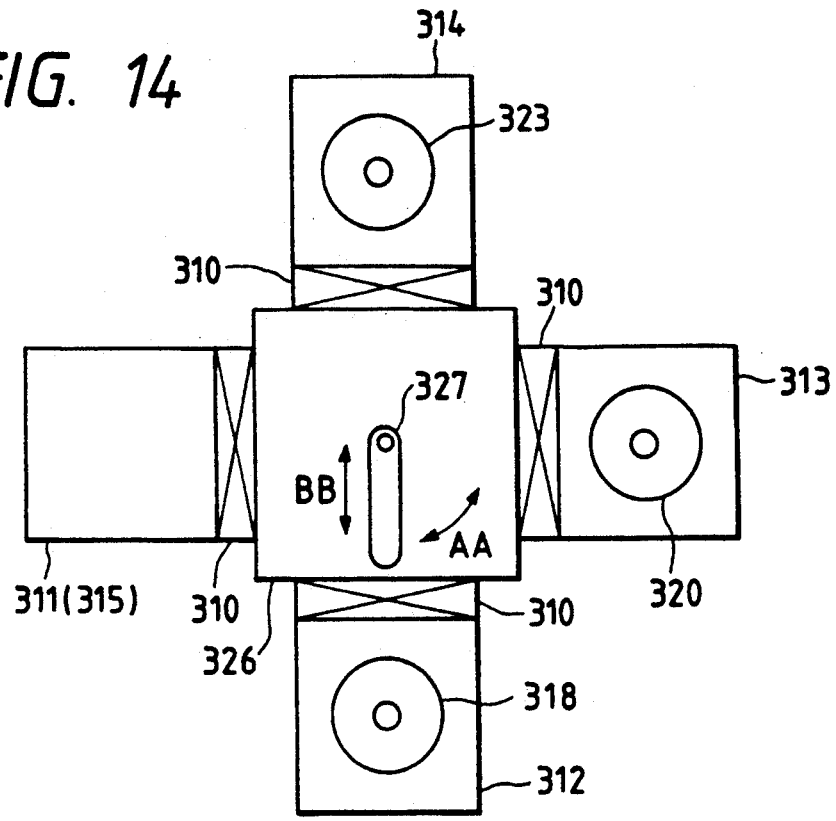
FIG. 14 is a schematic plan constitutional view of the device shown in FIGS. 12 and 13.

FIG. 12 to FIG. 14 show schematically a sequential metal film forming apparatus preferable for applying the film forming method as described above.

The sequential metal film forming apparatus, as shown in FIG. 12, is constituted of loadlock chamber 311 connected mutually communicated under shielding from outer air through the gate valves 310a to 310f, a CVD reaction chamber 312 as the first film forming chamber, an Rf etching chamber 313, a sputtering chamber 314 as the second film forming chamber and a loadlock chamber 315, and the respective chambers are constituted reducible in pressure by evacuation with the evacuation systems 316a to 316e. Here, the above loadlock chamber 311 is a chamber for replacing the substrate atmosphere before deposition treatment with $H_2$ atmosphere after evacuation in order to improve the throughput characteristic. The next CVD reaction chamber 312 is a chamber for selective deposition on the substrate according to the Al-CVD method as described above under normal pressure or reduced pressure, in which a substrate holder 318 having a heat-generating member 317 which can heat the substrate to be formed to a range of 200° C. to 450° C. is provided internally, and starting gases such as alkylaluminum hydride bubbled and gasified in the bubbler 319-1 are introduced into the chamber through the starting gas introducing line 319 for CVD, and also hydrogen gas as the reactive gas is introduced through the gasline 319'. The next Rf etching chamber 313 is a chamber for carrying out cleaning of the substrate surface after selective deposition (etching) under Ar atmosphere, and internally thereof are provided at least a substrate holder 320 capable of heating the substrate to a range of 100° C. to 250° C. and an electrode line for Rf etching 321, and also an Ar gas feeding line 322 is connected. The next sputtering chamber 314 is a chamber for depositing non-selectively a metal film by sputtering under Ar atmosphere on the substrate surface, and internally thereof are provided a substrate holder 323 heated within a range of 200° C. to 250° C. and a target electrode 324 for mounting a sputter target material 324a, and also an Ar gas feeding line 325 is connected. The final loadlock chamber 315 is a control chamber before taking out the substrate after completion of the metal film deposition into the outer air, and constituted so that the atmosphere may be replaced with $N_2$.

FIG. 13 shows another constitutional example of a sequential metal film forming apparatus preferable for applying the film forming method as described above, and the same portions as described above in FIG. 12 are made the same symbols. The difference of the apparatus in FIG. 13 from that in FIG. 2 resides in that a halogen lamp 330 is provided as the direct heating means and the substrate surface can be directly heated, and for that purpose, the substrate holder 312 is provided with a nail 331 for holding the substrate under suspended state.

By heating directly the substrate surface with such constitution, the deposition speed can be further improved as described above.

Figure 15:
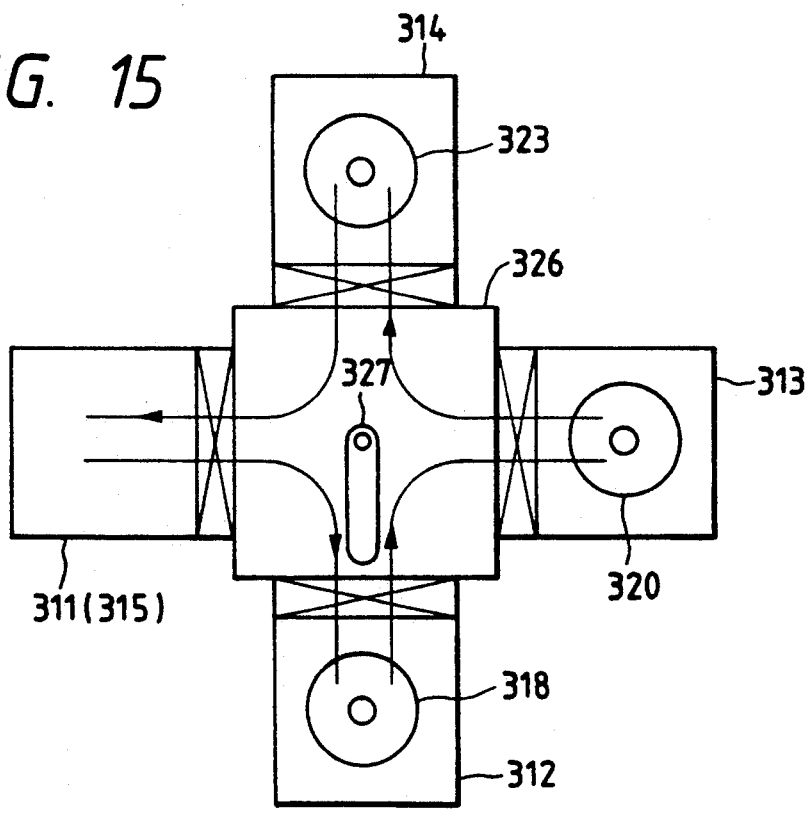
FIG. 15 is a schematic constitutional view with the movement order of the substrate in FIG. 14 being added with the arrowhead.

The sequential metal film forming apparatus with the above constitution, as shown in FIG. 14, is substantially equivalent to one with the structure having the above loadlock chamber 311, the CVD reaction chamber 312, the Rf etching chamber 313, the sputtering chamber 314, the loadlock chamber 315 connected mutually to one another with the conveying chamber 326 as the relay chamber. With this constitution, the loadlock chamber 311 functions also as the loadlock chamber 315. In the above conveying chamber 326, as shown in the Figure, an arm 327 as the conveying means reversibly rotatable in the AA direction and stretchable in the BB direction is provided, and with the arm 327, as shown in the arrowhead in FIG. 15, the substrate can be moved following the steps successively from the loadlock chamber 311 to the CVD chamber 312, the Rf etching chamber 313, the sputtering chamber 314, the loadlock chamber 315 without exposure to outer air.

Film Forming Procedure

The film forming procedure for forming the electrode and wiring according to the present invention is described.

FIG. 16 is a schematic perspective view for illustration of the film forming procedure for formation of the electrode and wiring according to the present invention.

First, the outline is described. A semiconductor substrate having openings formed on an insulating film is prepared, which substrate is arranged in a film forming chamber, and its surface is maintained at, for example, 260° C. to 450° C. to deposit selectively Al at the portion where the semiconductor is exposed according to the hot CVD method is a mixed atmosphere of DMAH as the alkylaluminum hydride and hydrogen gas. Of course, as described above, a metal film composed mainly of Al such as Al-Si, etc. may be also deposited selectively by introducing a gas containing Si atoms, etc. Next, on the Al selectively deposited by the sputtering method and the insulating film, Al or a metal film composed mainly of Al is non-selectively formed. Then, by patterning of the metal film non-selectively deposited to a desired wiring shape, electrodes and wirings can be formed.

Referring next to FIG. 13 and FIG. 16, description is made in more detail. First, a substrate is prepared. As the substrate, for example, a single crystalline Si wafer having an insulating film provided with openings with respective apertures provided thereon is prepared.

Figure 16A:
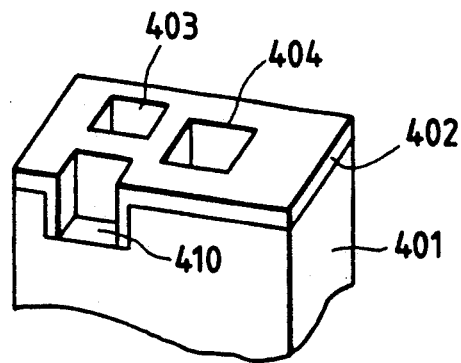
FIGS. 16A to 16D are schematic views for illustration of the film forming method suitable for formation of the wiring layer in the semiconductor device according to the present invention.

FIG. 16A is a schematic view showing a part of the substrate. Here, 401 is a single crystalline silicon substrate as a conductive substrate, 402 a thermally oxidized silicon film as the insulating film (layer). 403 and 404 are openings (exposed portions), having apertures different from each other. 410 is the groove bottom with Si exposed.

The procedure for forming Al film which becomes the electrode as the first wiring layer on the substrate is as follows with FIG. 13.

First, the substrate as described above is arranged in the loadlock chamber 311. Hydrogen is introduced into the loadlock chamber 311 to make it under hydrogen atmosphere. And, the reaction chamber 312 is internally evacuated to approximately $1 \times 10^{-8}$ Torr by the evacuation system 316b. However, Al film can be formed even if the vacuum degree within the reaction chamber 312 may be worse than $1 \times 10^{-8}$ Torr.

And, the gas of DMAH bubbled from the gasoline 319 is fed. For the carrier gas for the DMAH line, $H_2$ is employed.

The second gasline 319' is for $H_2$ as the reaction gas, and by flowing H2 through the second gas line 319' and controlling the opening degree of the slow leak valve not shown to adjust the pressure within the reaction chamber 312 to a predetermined value. A typical pressure in this case is preferably about 1.5 Torr. Through the DMAH line, DMAH is introduced into the reaction tube. The total pressure is made about 1.5 Torr, and the DMAH pressure $5.0 \times 10^{-3}$ Torr. Then, current is passed to the halogen lamp 330 to heat directly the wafer. Thus, Al is selectively deposited.

After elapse of a predetermined deposition time, feeding of DMAH is once stopped. The predetermined deposition time of the Al film deposited in this process is the time until the thickness of the Al film on the Si (single crystalline silicon substrate 1) becomes equal to the film thickness of the $SiO_2$ (thermally oxidized silicon film 2), and can be determined previously by experimentation.

Figure 16B:
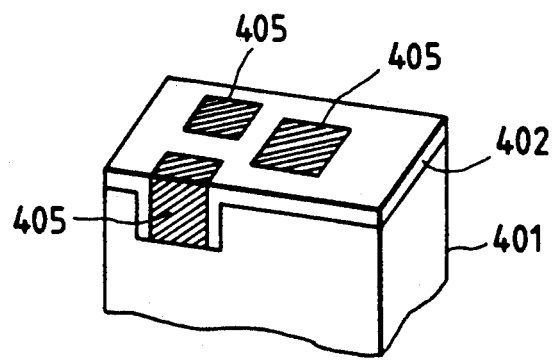

The temperature of the substrate surface by direct heating at this time is made about 270° C. According to the steps up to this stage, the Al film 405 is selectively deposited within the openings and the grooves as shown in FIG. 16B.

All of the steps as described above are referred to as the first film forming step for formation of electrode within contact hole.

After the above first film forming step, the CVD reaction chamber 312 is evacuated until reaching a vacuum degree of $5 \times 10^{-3}$ Torr or lower by the evacuation system 316b. At the same time, the Rf etching chamber 313 is evacuated to $5 \times 10^{-6}$ Torr or lower. After confirmation that the both chambers have reached the above vacuum degree, the gate valve 310c is opened, the substrate moved from the CVD reaction chamber 312 to the Rf etching chamber 313 by the conveying means, and the gate valve 310c closed. The substrate is conveyed to the Rf etching chamber 313, and the Rf etching chamber 313 is evacuated by means of the evacuation system 316c until reaching a vacuum degree of $10^{-6}$ Torr or lower. Then, argon is fed through the argon feeding line 322 for Rf etching, and the Rf etching chamber 313 maintained under an argon atmosphere of $10^{-1}$ to $10^{-3}$ Torr. The substrate holder 320 of Rf etching is maintained at about 200° C., Rf power of 100 W supplied to the electrode for Rf etching 321 for about 60 seconds, and discharging of argon is caused to occur within the Rf etching chamber 313 for about 60 seconds. By doing so, the surface of the substrate can be etched with argon ions to remove unnecessary surface layer of the CVD deposited film. The etching depth in this case is made about 100 Å in terms of the oxide.

Here, surface etching of the CVD deposited film is effected in the Rf etching chamber, but since the surface layer of the CVD film of the substrate conveyed through vacuum contains no oxygen, etc., no Rf etching may be effected. In that case, the Rf etching chamber 313 function as the temperature changing chamber for effecting temperature change within a short time, when the temperatures in the CVD reaction chamber 12 and the sputtering chamber 314 are greatly different.

In the Rf etching chamber 313, after completion of Rf etching, flowing of argon is stopped, and the argon within the Rf etching chamber 313 is evacuated. After the Rf etching chamber 313 is evacuated to $5 \times 10^{-6}$ Torr and the sputtering chamber 314 to $5 \times 10^{-6}$ Torr or lower, the gate valve 310d is opened. Then, the substrate is moved from the Rf etching chamber 313 to the sputtering chamber 314 by means of a conveying means, followed by closing of the gate valve 310d.

After the substrate is conveyed to the sputtering chamber 314, the sputtering chamber 314 is made under an argon atmosphere of $10^{-1}$ to $10^{-3}$ Torr similarly as in the Rf etching chamber 313, and the temperature of the substrate holder 323 for mounting the substrate set to about 200° to 250° C. And discharging of argon is effected at a DC power of 5 to 10 kw to cut a target material such as Al or Al-Si (Si: 0.5%) and effect film formation of a metal such as Al, Al-Si, etc. at a deposition speed of about 10,000 Å/min. on the substrate. This step is a non-selective deposition step. This is called the second film forming step for formation of the wiring to be connected to the electrode.

After formation of a metal film of about 5000 Å, flowing of argon and application of DC power are stopped. After evacuation of the loadlock chamber 311 to $5 \times 10^{-3}$ Torr or lower, the gate valve 310e is opened and the substrate moved. After the gate valve 310e is closed, $N_2$ gas is permitted to flow into the loadlock chamber 311 until reaching atmospheric pressure, the gate valve 310f opened and the substrate taken out of the apparatus.

Figure 16C:
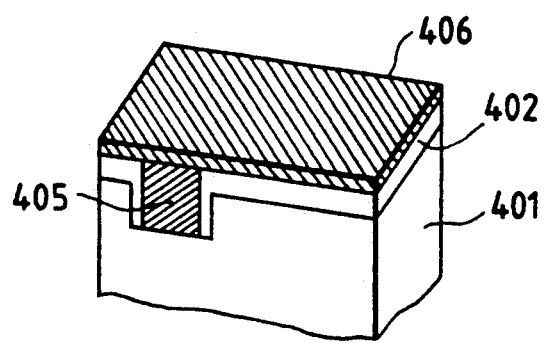

According to the second Al film deposition step as described above, the Al film 406 can be formed on the $SiO_2$ film 402 as shown in FIG. 16C.

Figure 16D:
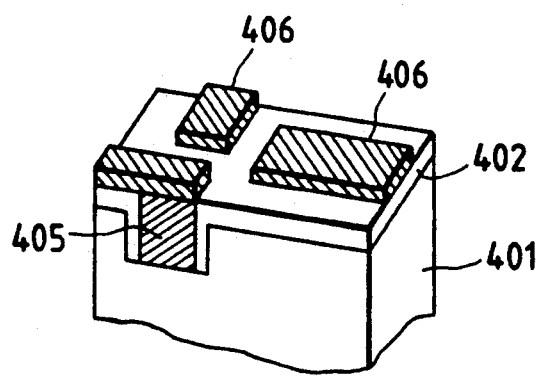

And, by patterning the Al film 406 as shown in FIG. 16D, a wiring with a desired shape can be obtained.

EXPERIMENTAL EXAMPLES

In the following, how excellent is the above-described Al-CVD method is and how good of the quality the Al film deposited within the openings is are described based on the experimental results.

First, as the substrate, a plurality of N-type single crystalline silicon wafers were prepared, which are thermally oxidized on the surface to form $SiO_2$ of 8000 Å, and have various openings with various apertures from 0.25 μm×0.25 μm square to 100 μm×100 μm square patterned to have the subbing Si single crystal exposed (Sample 1-1).

These are subjected to formation of Al films according to the Al-CVD method under the conditions as described below. Under the common conditions by use of DMAH as the starting gas, and hydrogen as the reaction gas, a total pressure of 1.5 Torr, a DMAH partial pressure of $5.0 \times 10^{-3}$ Torr, the power amount passed through the halogen lamp is adjusted and the substrate surface temperature set within the range of 200° C. to 490° C. to form films.

The results are shown in Table 1.

TABLE 1

| Substrate surface temperature (°C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Deposition speed (Å/min.) | ←1000~1500→ | | | ← | ← | ← | ← | 3000~5000 | | | → | → | → | → | → |
| Line defect of Si | ←Not recognized→ | | | → | → | → | → | → | → | → | → | → | → | → | → |
| Carbon content | ←Not detected→ | | | → | → | → | → | → | → | → | → | → | → | → | → |
| Resistivity (μΩcm) | ←2.7~3.3→ | | | ← | ← | ← | ← | ← | 2.8~3.4 | | → | → | → | → | → |
| Reflectance (%) | ← | 85~95→ | | → | ← | ← | ← | ←90~95 | | → | ← | ← | ~60 | → | → |
| Hillock density of 1 μm or more (cm$^{-2}$) | ←1~10$^2$ | | → | ← | ← | ← | ← | ←0~10 | | → | ← | ←10~10$^4$ | | → | → |
| Spike generation (%) (destruction probability of 0.15 μm junction) | ← | ←0→ | | → | → | → | → | → | → | → | ← | ←0~30 | | → | → |

As can be seen from Table 1, at a substrate surface temperature by direct heating of 260° C. or higher, Al is deposited selectively at a high deposition speed of 3000 to 5000 Å/min. within the openings.

When the characteristics of the Al film within the openings at substrate surface temperature range of 260° C. to 440° C. are examined, they are found to be excellent such that no carbon is contained, with resistivity being 2.8 to 3.4 μΩcm, reflectance 90 to 95%, hillock density of 1 μm or higher 0 to 10 and substantially no spike generation (destruction probability of 0.15 μm junction).

In contrast, at substrate surface temperatures of 200° C. to 250° C., the film is found to be considerably good as compared with the prior art although the film quality is slightly worse as compared with the case of 260° C. to 440° C., but the deposition speed is 1000 to 1500 Å/min., which can never be said to be sufficiently high.

When the substrate surface temperature becomes 450° C. or higher, the characteristics of the Al film with the openings are lowered with the reflectance becoming 60% or less, hillock density of 1 μm or more 10 to 10$^4$ cm$^{-2}$, alloy spike generation 0 to 30%.

Next, description is made about how suitably the method as described above can be used openings such as contact hole or thru-hole.

That is, it can be also preferably applied to the contact hole/thru-hole structure comprising the material as described below.

On the sample 1-1 as described above, an Al film is formed on a substrate (sample) as described below under the same conditions as when the Al film is formed.

On a single crystalline silicon as the first substrate surface material is formed a silicon oxide film according to the CVD method as the second substrate surface material, and patterning effected according to the photolithographic steps to have the single crystalline silicon surface partially exposed.

The film thickness of the thermally oxidized $SiO_2$ film has a film thickness of 8000 Å, the exposed portion of the single crystalline silicon a size of 0.25 μm×0.25 μm to 100 μm×100 μm. Thus, sample 1-2 is prepared (hereinafter such samples are represented as "CVD SiO$_2$ (hereinafter abbreviated as SiO$_2$/single crystalline silicon").

Sample 1-3 is boron doped oxide film formed by normal pressure CVD (hereinafter abbreviated as BSG)/single crystalline silicon, sample 1-4 phosphorus doped oxide film formed by normal pressure CVD (hereinafter abbreviated as PSG)/single crystalline silicon, sample 1-5 phosphorus and boron doped oxide film formed by normal pressure CVD (hereinafter abbreviated as BSPG)/single crystalline silicon, sample 1-6 nitride film formed by plasma CVD (hereinafter abbreviates as P-SiN)/single crystalline silicon, sample 1-7 hot nitride film (hereinafter abbreviated as T-SiN)/single crystalline silicon, sample 1-8 nitride film formed by low pressure CVD (hereinafter abbreviated as LP-SiN)/single crystalline silicon, sample 1-9 nitride film formed by means of an ECR apparatus (hereinafter abbreviated as ECR-SiN)/single crystalline silicon.

Further, according to all combinations of the first substrate surface materials (18 kinds) and the second substrate surface materials (9 kinds), samples 1-11 to 1-179 (note: sample Nos. 1-10, 20, 30, 40, 50, 60, 70, 80, 90, 100, 110, 120, 130, 140, 150, 160, 170 are lacking) are prepared. As the first substrate surface material, single crystalline silicon (single crystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-si), titanium aluminum (Al-Ti), titanium nitride (Ti-N), copper (Cu), aluminum silicon copper (Al-Si-Cu), aluminum palladium (Al-Pd), titanium (Ti), molybdenum silicide (Mo-Si), tantalum silicide (Ta-Si) are employed. As the second substrate surface material, T-SiO$_2$, SiO$_2$, BSG, PSG, BPSG, P-SiN, T-SiN, LP-SiN, ECR-SiN are employed. For all of the samples as described above, good Al films comparable with the sample 1-1 could be formed.

Next, on the substrate having Al deposited selectively as described above, Al is deposited non-selectively according to the sputtering method as described above, followed by patterning.

As the result, the Al film formed according to the sputtering method, and the Al film selectively selected within the openings are found to be under the contact state with both electrically and mechanically high durability due to good surface characteristic of the Al film.

As described above, according to the present invention, the control electrode is buried in the lower portion from the surface of the semiconductor substrate, an insulation gate type transistor with small area and flat surface can be realized, and therefore an insulation gate type transistor of high speed and high reliability can be obtained.

I claim:

1. A semiconductor device comprising:
   a semiconductor body having a recess formed therein;
   an impurity doped region formed within said semiconductor body;
   a gate electrode region provided directly on said impurity doped region and filling said recess formed in said semiconductor body;
   first and second semiconductor regions having said gate electrode region sandwiched therebetween, said first and second semiconductor regions being positioned on a surface of said semiconductor body and defining a source region and a drain region;
   an insulating film provided between said gate electrode region and a portion of said semiconductor body;
   a first channel constituting a first path at least partly in a direction substantially perpendicular to said surface and within said semiconductor body through which carriers flow into said second semiconductor region through said impurity doped region from said first semiconductor region; and
   a second channel constituting a second path in a direction along said surface of said semiconductor body through which carriers flow into said second semiconductor region from said first semiconductor region.

2. A semiconductor device according to claim 1, wherein said gate electrode region includes an aluminum electrode.

3. A semiconductor device according to claim 2, wherein said aluminum electrode is made of a monocrystalline aluminum.

* * * * *

UNITED STATES PATENT AND TRADEMARK OFFICE
CERTIFICATE OF CORRECTION

PATENT NO. : 5,302,846
DATED : April 12, 1994
INVENTOR(S) : SHIGEYUKI MATSUMOTO

Page 1 of 2

It is certified that error appears in the above-identified patent and that said Letters Patent is hereby corrected as shown below:

ON TITLE PAGE

In [57] References Cited, under OTHER PUBLICATIONS:
"MOSFET" should read --MOSFETS--.

COLUMN 1

Line 33, "structured." should read --structure.--.
Line 35, "Transistor" should read --transistor--.

COLUMN 3

Line 13, "use" should read --used--.

COLUMN 4

Line 37, "$(V_G - C_T)^2$" should read --$(V_G - V_T)^2$--.
Line 53, "1x10-5" should read --$1 \times 10^{-5}$--.

COLUMN 5

Lines 1-2, "channel." should read --a usable channel.--.
Line 13, "used" should read --is used--.
Line 60, "pyolysis" should read --pyrolysis--.

COLUMN 6

Line 50, "exist" should read --exists--.

COLUMN 8

Line 28, "mutually communicated" should read --communicate--.
Line 29, "310f," should read --310f, with--.

UNITED STATES PATENT AND TRADEMARK OFFICE
CERTIFICATE OF CORRECTION

PATENT NO. : 5,302,846
DATED : April 12, 1994
INVENTOR(S) : SHIGEYUKI MATSUMOTO

It is certified that error appears in the above-identified patent and that said Letters Patent is hereby corrected as shown below:

COLUMN 9

Figure 1:
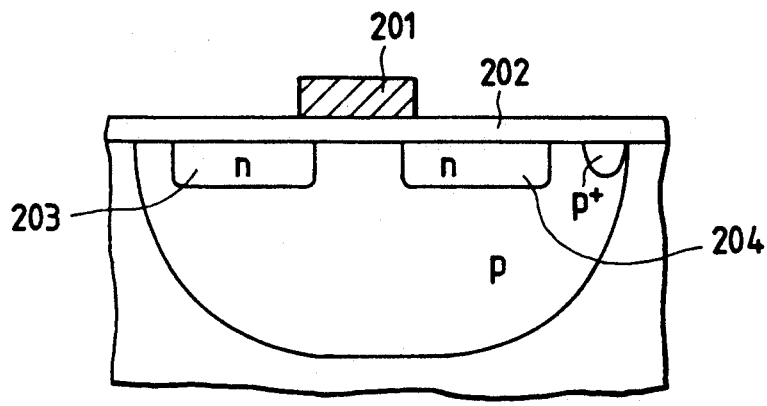
FIG. 1 to FIG. 3 are each a cross-sectional view of the MOS transistor of the prior art.
Figure 2:
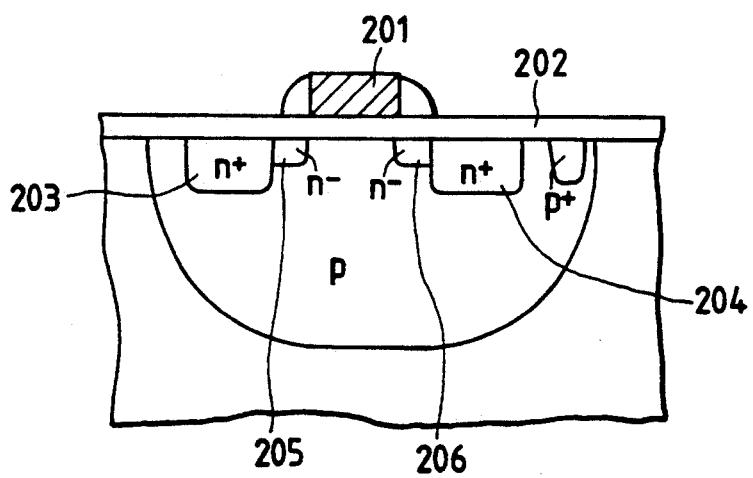
Figure 3:
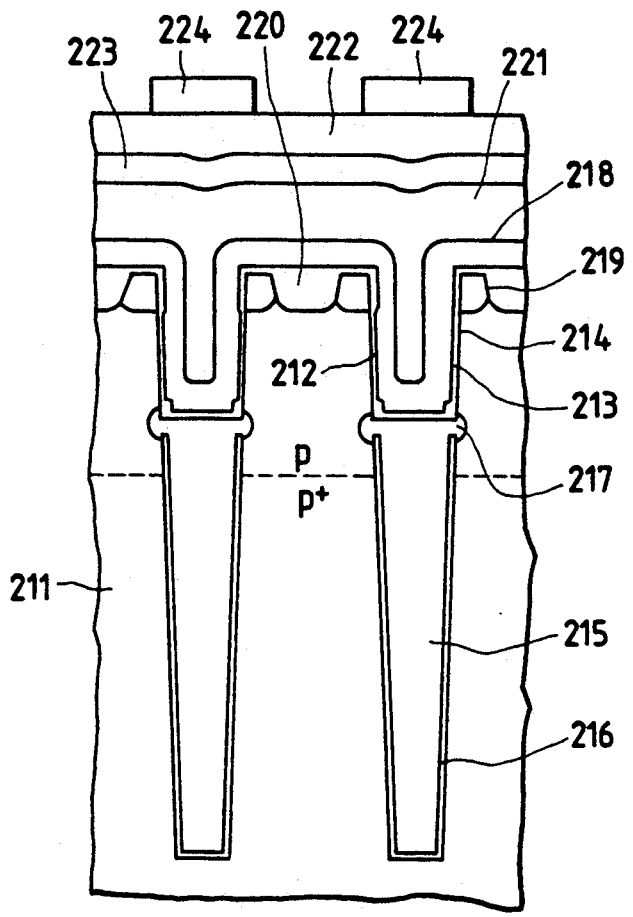

Line 6, "FIG. 2" should read --FIG. 12--.

COLUMN 10

Line 18, "H2" should read --$H_2$--.

COLUMN 11

Line 61, "is" should be deleted.
   Line 62, "of" should be deleted.

COLUMN 12

Line 52, "used openings" should read --used with openings--.

Signed and Sealed this

Twentieth Day of September, 1994

Attest:

BRUCE LEHMAN

Attesting Officer            Commissioner of Patents and Trademarks